United States Patent [19]
Ramamurthy et al.

[11] Patent Number: 5,790,563
[45] Date of Patent: Aug. 4, 1998

[54] SELF TEST OF CORE WITH UNPREDICTABLE LATENCY

[75] Inventors: Krishnan Ramamurthy, Santa Clara, Calif.; Rong Pan, Aberdeen, N.J.; Francois Ducaroir, Santa Clara, Calif.

[73] Assignee: LSI Logic Corp., Milpitas, Calif.

[21] Appl. No.: 879,673

[22] Filed: Jun. 23, 1997

Related U.S. Application Data

[63] Continuation of Ser. No. 597,015, Feb. 5, 1996, abandoned.

[51] Int. Cl.⁶ .................................................. G06F 11/00
[52] U.S. Cl. ............................................................ 371/25.1
[58] Field of Search .................................................. 371/25.1

[56] References Cited

U.S. PATENT DOCUMENTS

| | | | |
|---|---|---|---|
| 4,071,887 | 1/1978 | Daly et al. | 364/200 |
| 4,271,513 | 6/1981 | Maejima et al. | 371/22 |
| 4,486,739 | 12/1984 | Franaszek et al. | 340/347 |
| 4,631,719 | 12/1986 | Huffman et al. | 370/15 |
| 4,908,819 | 3/1990 | Casady et al. | 370/15 |
| 4,975,916 | 12/1990 | Miracle et al. | 371/47.1 |
| 4,979,185 | 12/1990 | Bryans et al. | 375/20 |
| 5,010,559 | 4/1991 | O'Connor et al. | 375/116 |
| 5,025,458 | 6/1991 | Casper et al. | 375/114 |
| 5,040,195 | 8/1991 | Kosaka et al. | 375/114 |
| 5,043,931 | 8/1991 | Kovach et al. | 364/579 |
| 5,052,026 | 9/1991 | Walley | 375/119 |
| 5,111,451 | 5/1992 | Piasecki et al. | 370/29 |
| 5,265,089 | 11/1993 | Yonehara | 370/15 |
| 5,274,668 | 12/1993 | Marschall | 375/10 |
| 5,299,236 | 3/1994 | Pandula | 375/116 |
| 5,337,306 | 8/1994 | Hall | 370/13 |
| 5,343,461 | 8/1994 | Barton et al. | 370/13 |
| 5,353,250 | 10/1994 | McAdams | 365/189 |
| 5,448,571 | 9/1995 | Hong et al. | 370/105 |
| 5,473,758 | 12/1995 | Allen et al. | 395/430 |
| 5,481,543 | 1/1996 | Veltman | 370/112 |
| 5,577,039 | 11/1996 | Won et al. | 370/112 |

*Primary Examiner*—Vincent P. Canney
*Attorney, Agent, or Firm*—Conley, Rose & Tayon; Kevin L. Daffer

[57] ABSTRACT

A test method and means for in integrated circuit (10) having asynchronous communication capabilities including a transmitter (12) and a receiver (14). A pattern generator (24) is provided for generating patterns directly from within the integrated circuit (10). In the best presently known embodiment, a serializer (16) provides a serial output (20) and a deserializer (18) processes a serial input (22) into a parallel signal and provides the parallel signal to a receiver (14). The pattern generator (24) is preprogrammed to provide a parallel data pattern which can optionally and intermittently be provided to the transmitter (12) in a test mode (44). In the test mode (44), signal is routed from the serializer (16) directly to the deserializer (18) via an external loop back path (34) or an internal alternative loop back path (34a). When in the test mode, comparison unit (38) internally generates a pattern identical to that produced by the pattern generator (24) and locks onto signal received from the receiver (14) to perform a functional test (54) and an optional parametric test (58).

12 Claims, 2 Drawing Sheets

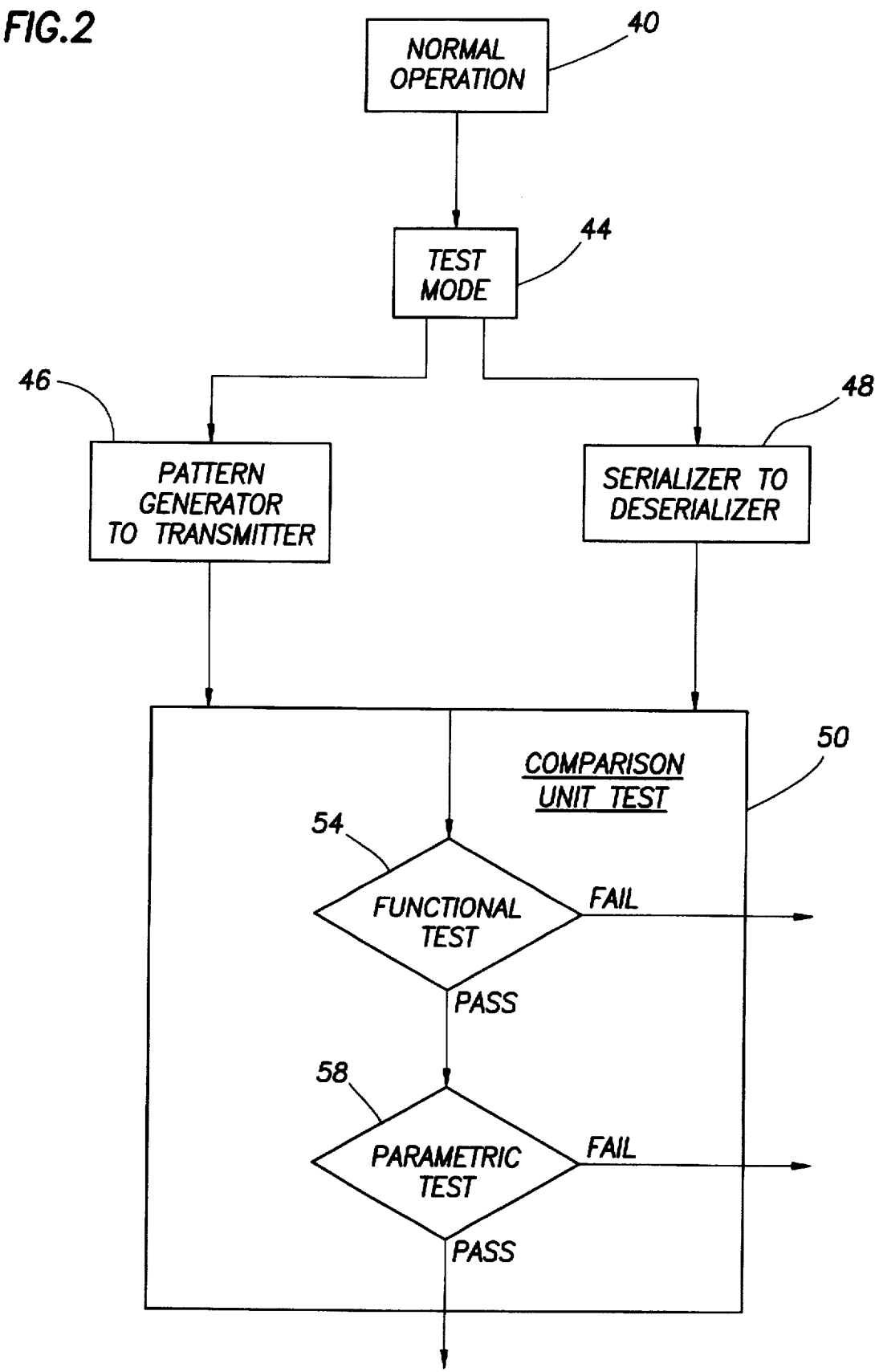

SELF TEST OF CORE WITH UNPREDICTABLE LATENCY

This application is a continuation of application Ser. No. 08/597,015, filed Feb. 5, 1996, now abandoned.

TECHNICAL FIELD

The present invention relates to the field of integrated circuitry, and particularly to a method and means for testing asynchronous communication circuits. The predominant current usage of the present inventive self test of core with unpredictable latency is in the production of asynchronous communication integrated circuits.

CROSS REFERENCES TO RELATED APPLICATIONS

This application is being filed generally concurrently with the following applications, and these are incorporated herein by reference. U.S. patent application Ser. No. 08/586,173 filed on Jan. 17, 1996 for a WRAP BACK TEST SYSTEM AND METHOD; U.S. patent application Ser. No. 08/596,816 filed on Feb. 5, 1996 for a FAST SYNCHRONIZATION METHOD; U.S. patent application Ser. No. 08/597,896 filed on filed on Feb. 5, 1996 for a HIGH SPEED PHASE LOCKED LOOP TEST METHOD AND MEANS; U.S. patent application Ser. No. 08/586,171 filed on Jan. 17, 1996 for a METHOD OF INTERLEAVING NETWORK TRAFFIC OVER SERIAL LINES; and U.S. patent application Ser. No. 08/596,987 filed on Feb. 5, 1996 for a PROGRAMMABLE SYNCHRONIZATION CHARACTER.

BACKGROUND ART

In the production of integrated circuits and, particularly in the production of circuits having asynchronous communication inputs and/or outputs, it is desirable to perform rather thorough testing at various stages of production as well as in the final product, in order to minimize costs associated with continued processing of bad parts and also the very great cost of producing and shipping bad parts.

Known methods for testing integrated circuits include providing externally generated signals from an off-chip source, such as from a commercial testing unit. While such methods have been generally adequate in the past, they are less than totally satisfactory in that an unpredictable latency is associated with the receiver element of the circuit under test. More specifically, data recovery phase locked loops ("PLLs") present in receiver circuits typically operate, under such test conditions, with unpredictable latency, which makes testability extremely difficult. This is because an asynchronous external signal might occur at any point in a cycle and, therefore, because it will take one full cycle plus an unpredictable portion of a cycle for the PLL to synchronize and lock. As a result, it is difficult to accurately determine when to look for an expected output state to result from a given input test state.

It would be desirable to have a method and means for testing integrated circuits which does not suffer from these problems associated with unpredictable latency. To the inventor's knowledge, no prior art method or means has adequately solved this problem in a way readily compatible with the cost and speed requirements of a production setting.

DISCLOSURE OF INVENTION

Accordingly, it is an object of the present invention to provide a circuit testing method and means which will accurately test asynchronous communication circuits.

It is another object of the present invention to provide an improved method and means for testing integrated asynchronous communication circuits which is quick enough to be used in a production setting and, further, to be repeated at various production stages should that alternative be desired.

It is yet another object of the present invention to provide a method and means for testing integrated asynchronous communication circuits which is inexpensive to implement.

It is still another object of the present invention to provide a method and means for testing asynchronous communication circuits which does not require extensive chip resources.

Briefly, the preferred embodiment of the present invention has a pattern generator which is present on the asynchronous communications integrated circuit, itself. The pattern generator has associated therewith intelligent self-test circuitry which alleviates the unpredictable latency problems discussed previously, herein, in relation to the prior art. The pattern generator is used to test the serializer/deserializer, as well as for parametric voltage output low/ voltage output high ("VOL/VOH") and voltage input low/ voltage input high ("VIL/VIH") type tests. It is a significant inventive aspect that a functional self-test, which tests for correct operation, is combined with a parametric self-test, which tests voltage levels in order to detect marginal conditions, and the like.

Optionally, the pattern generator can be provided with means for a user to introduce user-defined patterns from either on chip or external memory. This is useful if it is desired, for example to adopt a user-defined synchronization character.

The result of the inventive test method is a pass/nopass signal which indicates whether the entire test was completed successfully. Having such a signal output permits the external tester clock to be asynchronous with respect to the on-chip receiver clock.

An advantage of the present invention is that tests are generally accurate reflections of the operation of the chip under test.

A further advantage of the present invention is that tests can be performed quickly during production of an integrated circuit.

Yet another advantage of the present invention is that tests can be customized, as by defining a specific synchronization character to be generated, according to the intended purpose of the integrated circuit.

Still another advantage of the present invention is that the test is inexpensive to implement.

Yet another advantage of the present invention is that the means for performing the inventive method does not require extensive chip real estate.

These and other objects and advantages of the present invention will become clear to those skilled in the art in view of the description of the best presently known mode of carrying out the invention and the industrial applicability of the preferred embodiment as described herein and as illustrated in the several figures of the drawing.

BRIEF DESCRIPTION OF DRAWINGS

FIG. 2 is a flow diagram depicting the operation of the inventive test method.

BEST MODE FOR CARRYING OUT THE INVENTION

Figures 1, 3:
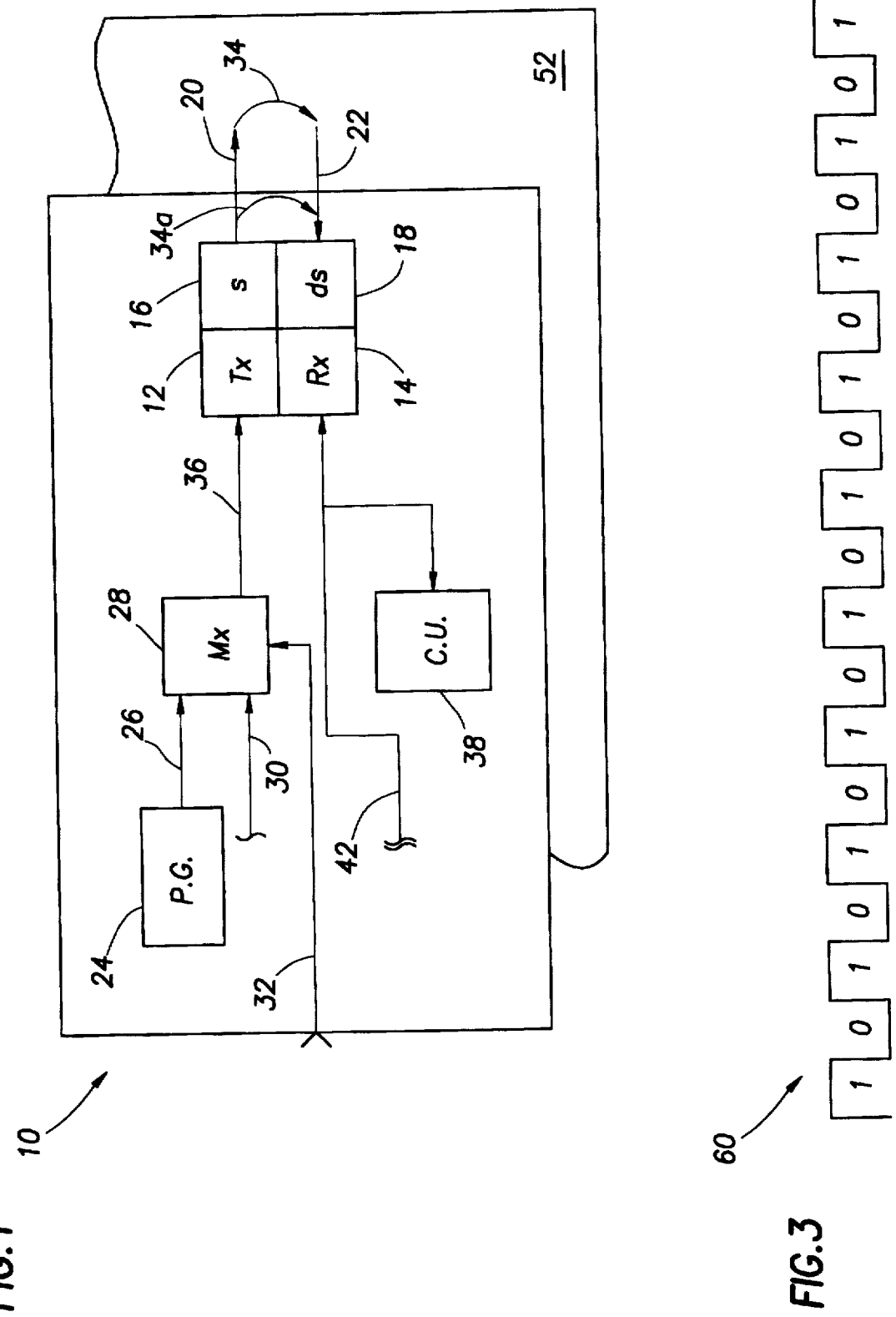
FIG. 1 is a block schematic diagram of an integrated circuit showing a pattern generator thereon according to the present inventive method and means.
FIG. 3 is a simplified 20 bit signal pattern such as might be used in the practice of the present invention.

The following detailed description illustrates the invention by way of example, not by way of limitation of the principles of the invention. The best presently known mode for carrying out the invention is an improvement to an integrated circuit core having a pattern generator incorporated into the chip design and associated with functional aspects of the chip as described herein.

An integrated circuit incorporating the inventive self test of core with unpredictable latency is depicted in a block schematic diagram in FIG. 1 and is designated therein by the general reference character 10. (It should be noted that the best presently known embodiment 10 of the present invention is actually embodied in a core design which is intended to constitute a subcomponent of an entire integrated circuit. However, this is not necessary to the practice of the present invention.)

The integrated circuit 10 has a transmitter 12 and a receiver 14, as is typical of a circuit having asynchronous communications functions. The particular integrated circuit 10 of the present example has a serializer 16 associated with the transmitter 12 and a deserializer 18 associated with the receiver 14. The serializer 16 provides specialized functions for converting incoming data from several data streams (as from a parallel input or several serial inputs) into a single serial output. The deserializer 16 separates a single serial input 22 into divergent outputs, as required, according to the specialized requirements of a particular application, which specialized requirements and applications are not directly relevant to the present invention. A pattern generator 24 provides a 20 bit output through a pattern generator output signal path 26 to a multiplexor 28. The output of the pattern generator 24 will represent a series of 20 bit digital values output in 20 bit parallel format. It should be noted that, in the view of FIG. 1, the parallel signal path 26 is designated by a single line, in order to reduce the complexity of the drawing. One skilled in the art will recognize that a 20 bit parallel signal path will actually have to consist of 20 distinct signal paths. Throughout the remainder of this disclosure it will be understood that, when referring to parallel signal paths, it is intended that as many distinct signal paths as are appropriate to the specific signal being discussed be understood.

In the best presently known embodiment 10 of the present invention, the multiplexor 28 acts as a switch to selectively provide a test signal from the pattern generator 24 or, alternatively, to provide signal to the transmitter 12 from a normal mode input line 30. The normal mode input line 30 is the signal path through which normal operation of the integrated circuit 10 occurs and is not directly relevant to the present invention. Connection to and signals occurring on the normal mode input line 30 will vary according to the actual application of the integrated circuit 10. A select line 32 is provided for switching the multiplexor 28 between the alternative signal inputs 26 and 30, thereby causing the integrated circuit 10 to selectively be in a test mode or a normal operating mode.

A loop back path is provided for routing the output of the serializer 16 to the input of the deserializer 18. As shown in the drawing of FIG. 1, the loop back path 34 is external to the integrated circuit 10. An alternative loop back path 34a is optionally provided for internally routing the output of the serializer 16 to the input of the deserializer 18. With the serial output 20 routed to the serial input 22 through either the loop back path 34 or the alternative loop back path 34a, and with the select line 32 enabled such that the multiplexor 28 routes the output of the pattern generator 24 to the transmitter 12 through a transmitter parallel input line 36, a parallel signal is received at a comparison unit 38 which should, if the transmitter 12, the serializer 16, the deserializer 18 and the receiver 14 are all functioning properly, should be functionally identical to the signal output from the pattern generator 24. In the best presently known embodiment 10 of the present invention, the comparison unit 38 is preprogrammed to generate patterns identical to those which the pattern generator 24 produces. Therefore, the comparison unit 38 can operate asynchronously as to the pattern generator 24.

FIG. 2 is a flow diagram depicting the operation of the integrated circuit 10 in relation to the inventive self test method and means. In a normal operation mode 40 signal is routed through the multiplexor 28 (FIG. 1) from the normal mode input line 30, to the transmitter 12. The parallel signal is then serialized in the serializer 16 and routed from the integrated circuit 10 through the serial output 20. Serial signals received at the integrated circuit 10 through the serial input 22 are deserialized by the deserializer 18 and routed to the receiver 14 and then through a normal output line 42 (FIG. 1). The normal output line 42 is the line through which signal normally flows from the receiver 14 into the remaining circuitry of the integrated circuit 10. Since any such additional circuitry of the integrated circuit 10 will vary from application to application of the present invention it is not depicted in the view of FIG. 1, and the normal output line 42 is shown unterminated.

Referring again to FIG. 2, a test mode 44 is initiated when the select line 32 (FIG. 1) is brought high, thereby causing the multiplexor 28 to direct the output of the pattern generator 24 to the transmitter 12. In the test mode 44, the output of the serializer 16 is directed to the deserializer 18 through the loop back path 34. As previously discussed, herein, the output of the serializer 16 may also be routed to the deserializer 18 via the alternative loop back path 34a, in the test mode 44. In order to illustrate that these operations are separately initiated, the diagram of FIG. 2 has a pattern generator to transmitter operation 46 block and a serializer to deserializer operation 48 block. The pattern generator to transmitter operation 46 illustrates the routing of (parallel) signal from the pattern generator 24 to the transmitter 12 and the serializer to deserializer operation 48 illustrates the separate routing of (serial) signal from the serializer 16 to the deserializer 18. One skilled in the art will recognize that when the external loop back path 34 is used, the external loop back path 34 may be part of an external test unit 52 such that the act of inserting the integrated circuit 10 into the external test unit 44 will, itself, complete the loop back path 34.

With the pattern generator to transmitter operation 46 and the serializer to deserializer operation 48 both accomplished, the comparison unit 38 will begin a comparison unit test 50. As has been briefly touched upon previously herein, in the comparison unit test 50, the comparison unit 38 will internally generate a pattern identical to that produced by the pattern generator 24. The comparison unit 38 will then lock onto the signal received from the receiver 14 and perform a functional test 54 to determine that the signal received from the signal received from the receiver 14 is identical to the signal internally produced in the comparison unit 38. Should this not be the case—that is, should the signal received from the receiver 14 differ numerically from the signal internally produced in the comparison unit 38, then an error condition will be indicated at a test failure output node 56.

It should be noted that, since a failure of the functional test 54 may indicate merely a failure of the comparison unit 38 to lock onto and synchronize with the output of the receiver 14, a condition which would in no way affect the usability or reliability of the integrated circuit 10, the inventors believe that it will be desirable to repeat the functional test 54 after an initial failure, should such initial failure occur. The number of times which it might be desirable to repeat the functional test 54 before finally declaring the integrated circuit 10 to "bad" will vary from application to application, and should be determined after statistical study and/or evaluation of the particular application.

As has also been briefly discussed herein, the inventors believe that it will be desirable, at least in many applications, to cause the comparison unit 38 to perform an optional parametric test 58. In the parametric test 58, the comparison unit 38 will compare the voltage levels of 1's and 0's received from the receiver 14 to determine if such levels are within a predetermined acceptable range. Here also, exactly what a predetermined acceptable voltage level might be will depend entirely upon nominal voltage levels and lay out of a particular application. Therefore, an acceptable level range will be determined on an application by application basis by either direct testing or simulation of a particular integrated circuit layout and design.

It will be noted that the exact pattern to be produced within the pattern generator 24 and the comparison unit 38 has not been specifically disclosed herein. Indeed, it is one of the advantages of the present invention that such a pattern can be caused to be essentially whatever data pattern is considered to be appropriate or typical to the intended application of the integrated circuit 10. In fact, it is even contemplated by the inventors that it may be desirable to provide a means for programming such a pattern into the program generator 24 and the comparison unit 38 after the integrated circuit 10 is already manufactured. However, for the purpose of illustrating the present invention, a very simple twenty bit signal pattern 60 (the example consisting of alternating high and low states to ideally preserve DC balance), such as might be generated in the pattern generator 24 and the comparison unit 38, is illustrated in FIG. 3. One skilled in the art will recognize that the signal pattern 60 graphically represents a serial signal pattern where the X axis is temporal and, alternatively, a parallel signal pattern where the X axis represents simultaneous but physically distinct states such as in the 20 bit parallel patterns discussed herein.

The circuitry and tests not specifically disclosed herein in detail are conventional in nature and well within the knowledge and scope of those skilled in the art of implementing such circuitry and tests in very large scale integrated circuits.

INDUSTRIAL APPLICABILITY

The inventive self test of core with unpredictable latency is intended to be widely used in the production of integrated circuit cores, and particularly highly complex cores. The inventive self test of core with unpredictable latency can be used in combination with loop back and wrap back tests which are the subject of copending U.S. Patent applications. The flexibility of testing thus provided is particularly important in a core-based integrated circuit (one built upon a combination of standard "core" configurations or upon a combination of a relatively standard core with custom circuitry), wherein rapid isolation of defects is an economic necessity. It is anticipated that the inventive self test of core with unpredictable latency will be widely used for testing, particularly production line testing, of integrated circuits having asynchronous communications capabilities.

Since the inventive self test of core with unpredictable latency may be readily produced and integrated into existing integrated circuit and core designs, and since the advantages as described herein are provided, it is expected that they will be readily accepted in the industry. For these and other reasons, it is expected that the utility and industrial applicability of the invention will be both significant in scope and long lasting in duration.

All of the above are only some of the examples of available embodiments of the present invention. Those skilled in the art will readily observe that numerous other modifications and alterations may be made without departing from the spirit and scope of the invention. Accordingly, the above disclosure is not intended as limiting and the appended claims are to be interpreted as encompassing the entire scope of the invention.

It should be understood that various modifications within the scope of this invention can be made by one of ordinary skill in the art without departing from the spirit thereof. We therefore wish our invention to be defined by the scope of the appended claims as broadly as the prior art will permit, and in view of the specification if need be.

We claim:

1. A method for testing an integrated circuit, comprising:
   providing a serial output port and a serial input port upon the integrated circuit;
   generating a digital signal from a pattern generator arranged upon the integrated circuit;
   serializing the digital signal;
   forwarding the serialized digital signal exclusively across the integrated circuit from the output port to the input port;
   deserializing the digital signal; and
   comparing the deserialized digital signal to the digital signal.

2. The method of claim 1, wherein
   said comparing comprises testing a serializer operably coupled to said output port and a deserializer operably coupled to said input port.

3. The method of claim 2, wherein
   said serializer and deserializer are contained upon said integrated circuit.

4. The method of claim 3, wherein
   the digital signal from the pattern generator is optionally routed as the serialized digital signal to the output port through a multiplexor.

5. The method of claim 1 wherein comparing comprises numerically comparing a numerical pattern of the deserialized digital signal to a numerical pattern of said digital signal to derive a functional test.

6. The method of claim 1 wherein
   comparing comprises comparing voltage levels of bits within the deserialized digital signal to voltage levels bits within said digital signal to derive a parametric test.

7. The method of claim 1, wherein
   the digital signal produced by the pattern generator is determined to be a typical synchronization character according to the intended use of the integrated circuit.

8. The method of claim 1, wherein
   the digital signal produced by the pattern generator is a numerical value, output in parallel, such that when the signal produced by the pattern generator is serialized it will be DC balanced.

9. An integrated circuit comprising an output port and an input port upon a monolithic substrate, said integrated circuit comprising:

a pattern generator for generating a digital signal;

a serializer coupled to serialize the digital signal upon the output port;

a connection between the output port and the input port for receiving the serialized digital signal upon the input port;

a deserializer coupled to deserialize the digital signal from the input port; and a comparison unit coupled to receive the deserialized digital signal from the input port and compare the deserialized digital signal with the digital signal for testing the serializer, output port, deserializer and input port.

10. The integrated circuit of claim 9, wherein the output port is coupled from the serializer which receives a parallel signal and outputs a serial signal; and the input port is coupled to the deserializer which receives a serial signal and outputs a parallel signal.

11. The integrated circuit of claim 9, wherein the digital signal generated by the pattern generator is optionally routed to the output port through a multiplexor.

12. The integrated circuit of claim 9, wherein the comparison unit synchronizes with the deserialized digital signal received from the output port and numerically compares the deserialized signal to a pattern generated in the comparison unit.

* * * * *